(12) United States Patent
Sugiyama et al.

(10) Patent No.: US 10,863,660 B2
(45) Date of Patent: Dec. 8, 2020

(54) STORED IMAGE RECLASSIFICATION SYSTEM AND RECLASSIFICATION METHOD

(71) Applicant: FUJI CORPORATION, Chiryu (JP)

(72) Inventors: Kenji Sugiyama, Anjo (JP); Hiroshi Oike, Chiryu (JP); Shuichiro Kito, Toyota (JP)

(73) Assignee: FUJI CORPORATION, Chiryu (JP)

( * ) Notice: Subject to any disclaimer, the term of this patent is extended or adjusted under 35 U.S.C. 154(b) by 28 days.

(21) Appl. No.: 16/348,674

(22) PCT Filed: Nov. 14, 2016

(86) PCT No.: PCT/JP2016/083726
§ 371 (c)(1),
(2) Date: May 9, 2019

(87) PCT Pub. No.: WO2018/087932
PCT Pub. Date: May 17, 2018

(65) Prior Publication Data
US 2019/0274238 A1    Sep. 5, 2019

(51) Int. Cl.
*H05K 13/08* (2006.01)
*G06T 7/70* (2017.01)
*H05K 13/04* (2006.01)
*G06K 9/00* (2006.01)
*G06K 9/62* (2006.01)
*G06T 7/00* (2017.01)
*H05K 13/00* (2006.01)

(52) U.S. Cl.
CPC ..... *H05K 13/0812* (2018.08); *G06K 9/00624* (2013.01); *G06K 9/628* (2013.01);
(Continued)

(58) Field of Classification Search
CPC .......... H05K 13/0812; H05K 13/0409; H05K 13/0813; H05K 13/00; G06T 7/70;
(Continued)

(56) References Cited

U.S. PATENT DOCUMENTS 5,638,465 A * 6/1997 Sano .................... G06K 9/6228
382/159
5,761,337 A * 6/1998 Nishimura ........... G01R 31/303
382/150

(Continued)

FOREIGN PATENT DOCUMENTS

JP    2012-169394 A    9/2012

OTHER PUBLICATIONS

International Search Report dated Feb. 14, 2017 in PCT/JP2016/083726 filed on Nov. 14, 2016.

*Primary Examiner* — Manav Seth
(74) *Attorney, Agent, or Firm* — Oblon, McClelland, Maier & Neustadt, L.L.P.

(57) ABSTRACT

A component picked up by a suction nozzle of a component mounting machine is imaged by a camera, the captured image is processed by an image recognition system to recognize the component, the image is determined to be normal or abnormal based on the recognition result, and in addition to classifying the image as a normal image or an abnormal image and storing the image in a storage device, component mounting boards, unloaded from a component mounting machine, are inspected with an inspection device. A stored image reclassification computer acquires the inspection result from the inspection device, reclassifies the normal image stored in the storage device, based on the inspection result, as an image whose determination as a normal image is suspect or as an image whose determination as a normal image is not suspect, and then stores the normal image in the storage device.

14 Claims, 10 Drawing Sheets

(52) U.S. Cl.
CPC ............ *G06K 9/6217* (2013.01); *G06T 7/001* (2013.01); *G06T 7/70* (2017.01); *H05K 13/00* (2013.01); *H05K 13/0409* (2018.08); *H05K 13/0813* (2018.08); *G06K 2209/19* (2013.01); *G06T 2207/30164* (2013.01)

(58) Field of Classification Search
CPC .......... G06T 7/001; G06T 2207/30164; G06K 9/00624; G06K 9/6217; G06K 9/628; G06K 2209/19
See application file for complete search history.

(56) References Cited

U.S. PATENT DOCUMENTS

| | | | |
|---|---|---|---|
| 6,178,626 B1* | 1/2001 | Hada | H05K 13/0812 29/833 |
| 6,910,262 B2* | 6/2005 | Shimizu | H05K 13/0452 29/743 |
| 7,054,841 B1* | 5/2006 | Tenorio | G06Q 20/382 705/51 |
| 7,062,081 B2* | 6/2006 | Shimoda | G06T 7/0004 356/237.3 |
| 7,352,890 B2* | 4/2008 | Shimoda | G06T 7/0004 356/237.3 |
| 8,768,514 B2* | 7/2014 | Hoshikawa | H04N 5/2354 700/259 |
| 10,066,926 B2* | 9/2018 | Onishi | G01B 11/14 |
| 10,634,325 B2* | 4/2020 | Sugihara | H01L 21/681 |
| 2014/0300730 A1* | 10/2014 | Onishi | H05K 13/0818 348/95 |
| 2019/0274238 A1* | 9/2019 | Sugiyama | H05K 13/0812 |

* cited by examiner

Normal

Misrecognition due to foreign particle

Misrecognition due to suction nozzle abrasion mark

STORED IMAGE RECLASSIFICATION SYSTEM AND RECLASSIFICATION METHOD

TECHNICAL FIELD

The present specification discloses a stored image reclassification system and method in which components picked up by a suction nozzle of a component mounting machine are imaged by a camera, and the captured images are classified as normal images or abnormal images and stored in a storage device, thereafter the stored images are reclassified.

BACKGROUND ART

Conventionally, in a component mounting machine, when a component supplied from a feeder is picked up by a suction nozzle and conveyed onto a circuit board, the component picked up by the suction nozzle is imaged by a camera, the captured image is processed to recognize the component, the component suction orientation or the like is determined to be normal or abnormal based on the recognition result, and in addition to mounting the component onto the circuit board, it is possible to examine the images captured at the time of an abnormality occurrence when investigating the cause of various abnormalities that have occurred in the component mounting machine, and images captured during production are classified as a normal image or an abnormal image and stored in a storage device. The stored images are also used to improve shape data of the component for image processing, to improve the recognition accuracy of the component suction orientation (i.e., the position and angle), and the like.

However, if all the images captured during production are stored in the storage device for a long period of time, the number of stored images becomes enormous, and therefore, it takes a great deal of time and labor to examine the stored images when investigating the cause of various abnormalities that have occurred in the component mounting machine.

In Patent Literature 1 (JP-A-2012-169394), only images for events that may cause changes in the operational state of a feeder or a mounting head are selected and stored in a storage device for a long period of time.

PATENT LITERATURE

Patent Literature 1: JP-A-2012-169394

SUMMARY OF INVENTION

Since various devices other than the feeder and the mounting head are mounted on the component mounting machine, the causes of various abnormalities occurring in the component mounting machine are not limited to only the feeder and the mounting head. Therefore, as described in Patent Document 1, if only images for events having caused changes in the operational state of a feeder or a mounting head are selected and stored, it is difficult to ascertain the cause of an abnormality caused by a device other than the feeder or the mounting head even if the stored images are examined.

However, as described above, when all images taken during production are saved, the number of saved images becomes enormous, and therefore, it takes a great deal of time and labor to examine the saved images when investigating the causes of various abnormalities occurring in the component mounting machine.

Further, component recognition results of the image recognition system of a component mounting machine are not necessarily accurate, rather there is a possibility that the image recognition system is misrecognizing. For example, FIGS. 2 to 4 are all images of components with leads that are classified as normal images, however, only the image of FIG. 2 is an image in which the component suction orientation (i.e., the position and angle) is correctly recognized, and the image of FIG. 3 is an example in which the component suction orientation is misrecognized by erroneously determining a foreign particle (e.g., a piece of dust) to be a lead, and the image of FIG. 4 is another example in which the component suction orientation is misrecognized by erroneously determining an abrasion mark on the lower surface of the suction nozzle, by which the component was not picked up due to a component pickup error, to be a lead. As described above, since images whose determination as a normal image is suspect are mixed in among the large number of stored normal images, when using the stored normal images, it is necessary for an operator to visually check the large number of normal images one by one and to reclassify the images whose determination as a normal image is suspect, such as shown in FIGS. 3 and 4, and it takes a great deal of time and effort to perform the operation.

Solution to Problem

In order to solve the above-mentioned problem, the present invention may be configured to: image a component by a camera, the component being picked up by a suction nozzle of a component mounting machine; recognize the component by processing the captured image using an image recognition system; determine the image to be normal or abnormal based on the recognition result; classify the image as a normal image or an abnormal image and store the image in a storage device, and inspect a component mounting board unloaded from the component mounting machine with an inspection device, wherein the stored image reclassification system has a reclassification section configured to reclassify the normal image, based on the inspection result of the inspection device, as an image whose determination as a normal image is suspect or as an image whose determination as a normal image is not suspect, and stores the normal image in the storage device.

For example, among the components determined to have a mounting defect (i.e., a deviation in mounting position) or to have not been mounted, whose determinations are made by the inspection device inspecting component mounting boards unloaded from the component mounting machine, there is a component for which the image recognition system of the component mounting machine may have erroneously determined the image of the component to be normal in a way such that the component suction orientation was misrecognized due to a foreign particle (e.g., a piece of dust), as shown in FIG. 3, or the component was misrecognized due to an abrasion mark on the lower surface of the suction nozzle for which a component pickup error had occurred, as shown in FIG. 4.

Therefore, an image that is classified as normal by the image recognition system of the component mounting machine is automatically reclassified based on the inspection result of the inspection device as an image whose determination as a normal image is suspect or as an image whose determination as a normal image is not suspect, after which the reclassified image is stored in the storage device. This eliminates the need for an operator to visually check and reclassify a large number of normal images stored in the storage device one by one, and when investigating the cause of a mounting failure or the like, the investigation target can be narrowed down to the images whose determination as a normal image is suspect, thereby the investigation of the cause can be proceeded efficiently in a relatively short time.

In this case, when an inspection device for inspecting whether the mounted state for each component mounted on the circuit board is acceptable is used as an inspection device, the reclassification section reclassifies, from among the normal images, the normal image of the component whose inspection result of the inspection device is unacceptable as the normal image for which the determination is suspect.

Further, the present invention may be configured to have the stored image reclassification system including a component suction orientation measurement section configured to measure positions and angles of components of multiple normal images stored in the storage device, and a reclassification section configured to statistically process the positions and the angles of the components of the normal images measured by the component suction orientation measurement section for each component type, and reclassify the normal image as an image for which the determination as a normal image is suspect or as an image for which the determination as a normal image is not suspect, based on whether the position or the angle of the component falls outside a predetermined variation range, and stores the normal image in the storage device. In general, it is presumed that components which have been stably mounted on mounting positions of boards by a component mounting machine have been picked up by a suction nozzle in a substantially similar orientation. Accordingly, the component suction orientation (i.e., the position and angle) of the multiple normal images stored in the storage device are measured, the measured values are then statistically processed for each component type, and though the image is determined to be a normal image by the image recognition system of the component mounting machine, if it is determined that the normal image has any measured value of the component suction orientation falling outside the predetermined variation range, the image is reclassified as an image whose determination as a normal image is suspect, because there is a possibility of erroneous image recognition.

In this case, the predetermined variation range may be set based on the standard deviation from an average value for the position and the angle of the component. In place of the average value, the median value, or the mode value, in other words, any value indicating the central position of the distribution of the measured values may be used.

The component suction orientation measurement section may also measure the position and angle of the component of the abnormal image stored in the storage device, and the reclassification section may reclassify the abnormal image as an image whose determination as an abnormal image is suspect or as an image whose determination as an abnormal image is not suspect, based on whether both the position and the angle of the component of the abnormal image measured with the component suction orientation measurement section are within a predetermined variation range of the normal image of the same component type as the component, and store the abnormal image in the storage device In other words, the component suction orientation (i.e., the position and angle) of the abnormal image stored in the storage device is measured, and if the measured values of the component suction orientation of the abnormal image are within the predetermined variation range of the component suction orientation of a normal image of the same component type, the abnormal image may be within the predetermined variation range of a normal image, there is a possibility that the component suction orientation was misrecognized, thus the determination of the abnormal image by the image recognition system of the component mounting machine is reclassified as being suspect.

Further, a configuration of the present invention may include: a normal image selection section configured to select a normal image whose determination as a normal image is not suspect from among multiple normal images stored in a storage device, and a template image creation section configured to create a template image by moving and rotating the normal image so that the position and the angle of the component of the normal image selected by the normal image selection section coincide with the position and angle of a reference position; a matching processing section for matching remaining normal images using the template image created by the template image creation section; and a reclassification section for reclassifying the normal image as an image whose determination as a normal image is suspect or as an image whose determination as a normal image is not suspect based on the processing result of the matching processing section, and store the image in the storage device. In this manner, a template image is created by selecting a normal image whose determination as a normal image is not suspect, from among multiple normal images stored in the storage device, and a matching process is performed on the remaining normal images using the template image, by which a correlation value and a deviation amount, serving as indices indicating the correlation (i.e., the similarity) between the two images, can be obtained. When the correlation between the two images is low (i.e., the correlation value is low, or the deviation amount is very different from the recognition result of the image recognition system of the component mounting machine), though the image recognition system of the component mounting machine determines that the image is a normal image, there is a possibility that the image was misrecognized, and the image is therefore reclassified as an image whose determination as a normal image is suspect.

In this case, the normal image selection section may select a normal image whose determination as a normal image is not suspect from among multiple normal images stored in the storage device based on the inspection result of the inspection device, which inspects component mounting boards unloaded from the component mounting machine.

Alternatively, the normal image selection section may measure the positions and angles of components of multiple normal images stored in the storage device, perform statistical processing on the measured values for each component type, and select a normal image whose determination as a normal image is not suspect (e.g., a normal image located at the center of the distribution) from the multiple normal images based on the processing result.

Alternatively, the normal image selection section may create an average normal image from multiple normal images stored in the storage device and select the average normal image as a normal image whose determination as a normal image is not suspect.

Further, the matching processing section may perform a matching process on the abnormal image using the template image, and the reclassification section may reclassify the abnormal image as an image whose determination as an abnormal image is suspect or as an image whose determination as an abnormal image is not suspect based on the processing result of the matching processing section, and store the image in the storage device. In other words, a matching process is performed on an abnormal image using the template image created using a normal image whose determination as a normal image is not suspect, and in the case where the correlation between the two images is high, even if the image recognition system of the component mounting machine determines that the image is an abnormal image, the image is reclassified as an image whose determination as an abnormal image is suspect since there is a possibility that the image was misrecognized.

Alternatively, a classifier for recognizing a component may be created by learning a normal image reclassified by the reclassification section as a normal image whose determination as a normal image is not suspect. By doing so, it is possible to learn only the normal image whose determination as a normal image is not suspect as learning data for creating a high-precision classifier, and by mounting this classifier in the image recognition system of the component mounting machine, it is possible to improve the component recognition accuracy of the image recognition system of the component mounting machine.

DESCRIPTION OF EMBODIMENTS

Figure 1:
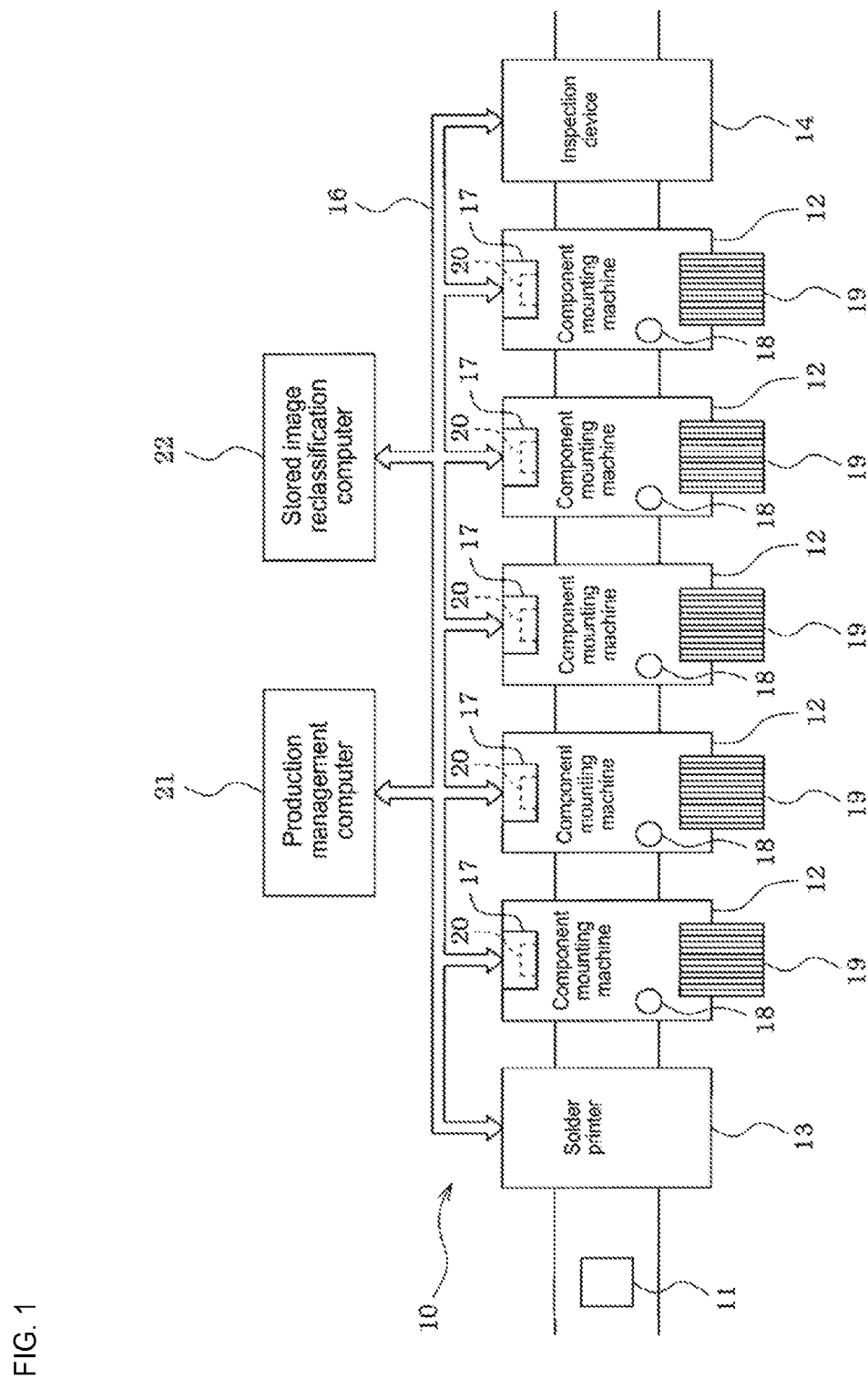
FIG. 1 is a block diagram schematically showing a configuration of a component mounting line and a stored image reclassification system of embodiment 1.
Figure 2:
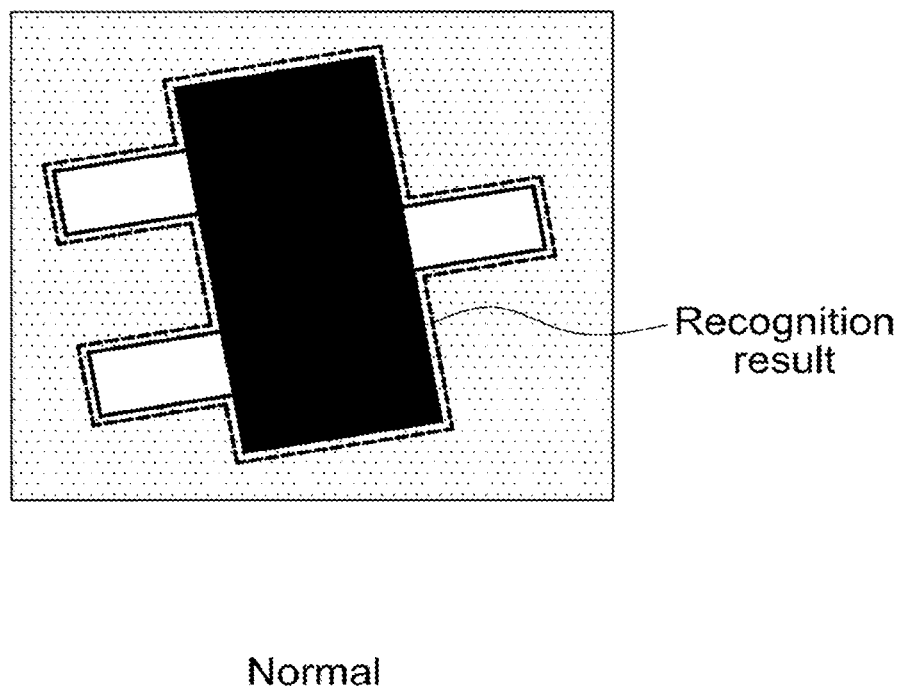
FIG. 2 is a diagram showing an example of a normal image in which the suction orientation of a component with leads is correctly recognized.

Hereinafter, three embodiments, embodiments 1 to 3, will be described.

Embodiment 1

Embodiment 1 will be described with reference to FIGS. 1 to 5. First, the configuration of component mounting line 10 will be described with reference to FIG. 1. Component mounting line 10 is configured by arranging one or multiple component mounting machines 12 and mounting-related machines such as solder printer 13 and a flux coating device (not shown) along a conveying direction of circuit board 11. Inspection device 14, which can be an appearance inspection device for inspecting whether the mounted state of each component mounted on circuit board 11 is acceptable, is installed on the side of component mounting line 10 from which the board is unloaded. The number of inspection devices 14 installed in component mounting line 10 is not limited to one but may be a multiple, and some inspection devices 14 may be installed between component mounting machines 12 in the middle of component mounting line 10.

Component mounting machine 12, solder printer 13, and inspection device 14 of component mounting line 10 are connected via network 16 to production management computer 21 in a mutually communicable manner, and production by component mounting line 10 is managed by production management computer 21. In accordance with the production job transmitted from production management computer 21, a predetermined number of components can be mounted on circuit board 11, such that each component mounting machine 12 repeats the operations of: moving mounting head 18 along the path consisting of a component pickup position→a component imaging position→a component mounting position; picking up the component supplied by feeder 19 with a suction nozzle (not shown) of mounting head 18 and imaging the component with the component imaging camera (not shown); processing the captured image with image recognition system 17 of component mounting machine 12 to measure the suction orientation (i.e., the position X, Y and the angle θ) of the component; correcting any deviation of the position X, Y and the angle θ of the component, and mounting the component on circuit board 11.

Further, image recognition system 17 of each component mounting machine 12 determines whether the image captured with the component imaging camera is normal or abnormal based on a component recognition result, classifies the image as a normal image or an abnormal image, and stores the normal image or the abnormal image in storage device 20. Storage device 20 has a storage capacity capable of storing the number of images necessary to investigate a cause when an abnormality of component mounting machine 12 occurs, which is configured by a rewritable nonvolatile storage medium, such as a hard disk device or the like, with holding stored data even in a power-off state. When the number of stored images in storage device 20 exceeds a predetermined number or a predetermined memory capacity, the oldest stored image is automatically deleted and the most recent image is stored.

The component mounting board produced by sequentially passing through component mounting machines 12 of component mounting line 10 is loaded into inspection device 14, and whether the mounting state is acceptable is inspected for each component mounted on circuit board 11. Stored image reclassification computer 22 is connected to network 16, and the inspection result (pass/fail) of inspection device 14 is transmitted to production management computer 21 and stored image reclassification computer 22.

Figure 3:
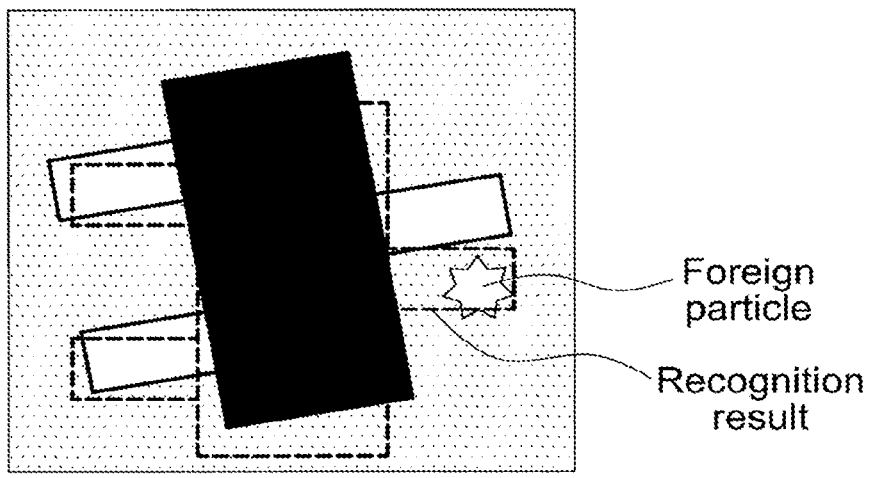
FIG. 3 is a diagram showing an example of a normal image in which, due to a foreign particle, the suction orientation of a component with leads is misrecognized.
Figure 4:
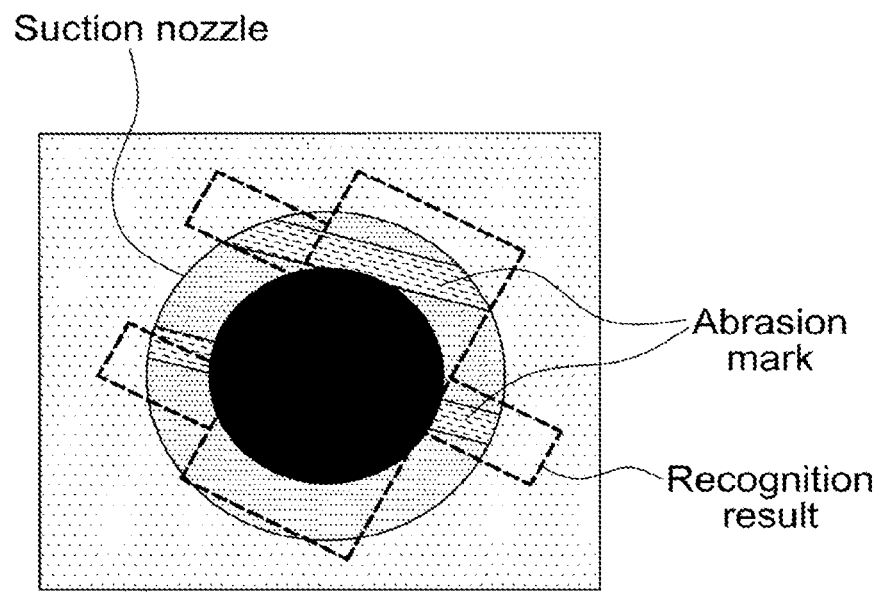
FIG. 4 is a diagram showing an example of a normal image in which abrasion marks, on the lower surface of the suction nozzle to which a component is not picked up, are erroneously determined to be leads and the component is misrecognized.

Among the components determined to have a mounting defect (i.e., a deviation in mounting position) or to have not been mounted, whose determinations are made by inspection device 14 inspecting component mounting boards unloaded from component mounting machine 12, there is a component for which image recognition system 17 of the component mounting machine 12 may have erroneously determined the image of the component to be normal in a way such that the component suction orientation was misrecognized due to a foreign particle (e.g., a piece of dust), as shown in FIG. 3, or the component was misrecognized due to an abrasion mark on the lower surface of the suction nozzle to which a component pickup error had occurred, as shown in FIG. 4.

For this reason, stored image reclassification computer 22 executes the stored image reclassification program of FIG. 5, which will be described later, to thereby function as a "reclassification section" for reading out the normal image stored in storage device 20, reclassifying the normal image as an image whose determination as a normal image is suspect or as an image whose determination as a normal image is not suspect based on the inspection result of inspection device 14, and storing the normal image in storage device 20. Here, "determination as a normal image is suspect" means "there is a possibility that the image is not a normal image". When storing the results of the reclassification, the file names of the reclassified images may be sorted according to their classification and written in a text file, the storage area for storing the reclassified images may be divided for according to classification, a specific character string indicating the classification may be added to the file name of the reclassified image, and in short, the operator may easily visually confirm the result of the reclassification.

Further, in embodiment 1, in order for inspection device 14 to inspect whether the mounted state for each component mounted on circuit board 11 is acceptable, stored image reclassification computer 22 reclassifies, as images whose determination as a normal image is suspect, the normal images of components for which the inspection result of inspection device 14 has failed from among the normal images stored in storage device 20 of component mounting machine 12.

When image recognition system 17 of component mounting machine 12 determines that an image of a component picked up by the suction nozzle is an abnormal image, the component is discarded and is not mounted on circuit board 11 so that a component whose image was determined to be abnormal is not inspected by inspection device 14.

The reclassification of the normal image of embodiment 1 described above is executed by stored image reclassification computer 22, in accordance with the stored image reclassification program of FIG. 5, as follows. The stored image reclassification program shown in FIG. 5 is started during production (i.e., during operation of the component mounting machine 12) or after production is completed. When there is space in the CPU processing capacity of the control device, which is the main part of image recognition system 17 of component mounting machine 12, the stored image reclassification program of FIG. 5 may be executed by the control device of component mounting machine 12. In this case, since the control device of component mounting machine 12 also functions as a "reclassification unit", it is not necessary to provide stored image reclassification computer 22. Alternatively, the stored image reclassification program of FIG. 5 may be executed by production management computer 21. In this case, since production management computer 21 also functions as a "reclassification unit", it is not necessary to provide stored image reclassification computer 22.

Figure 5:
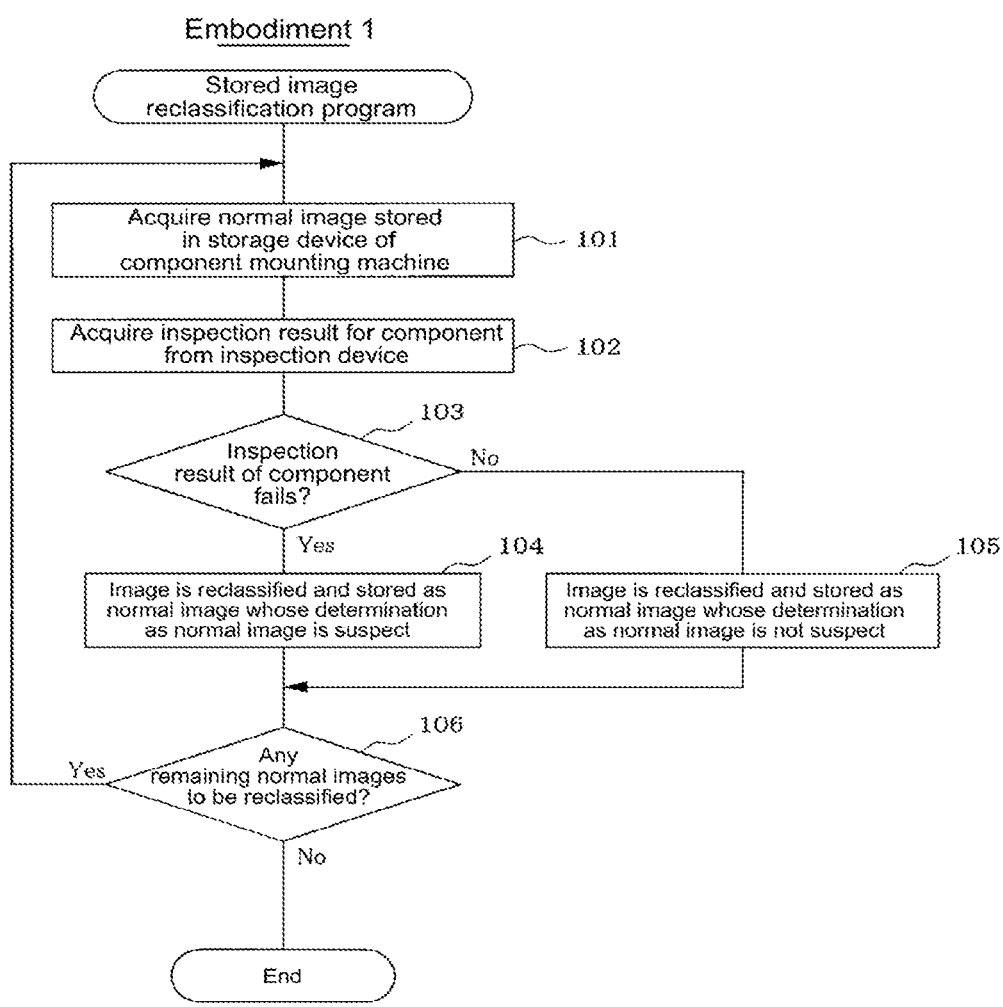
FIG. 5 is a flowchart showing the flow of processing in the stored image reclassification program according to embodiment 1.

When the stored image reclassification program of FIG. 5 starts, first, in step 101, a normal image stored in storage device 20 of component mounting machine 12 is acquired, and in the next step, step 102, the inspection result for the component in the normal image is acquired from inspection device 14.

Thereafter, the process proceeds to step 103, where it is determined whether the inspection result of the component fails, and if the inspection result is determined to have failed, the process proceeds to step 104, where the normal image is reclassified as an image whose determination as a normal image is suspect and then the image is stored in storage device 20, after which the process proceeds to step 106. On the other hand, if it is determined in step 103 that the inspection result of the component passes, the process proceeds to step 105, where the normal image is reclassified as a normal image and stored in the storage device 20, after which the process proceeds to step 106.

In step 106, it is determined whether a normal image to be reclassified remains, and if it is determined that a normal image remains, the above-described process of step 101 and subsequent steps is repeated, the normal image is reclassified as an image for which the determination as a normal image is suspect or not suspect based on the inspection result of inspection device 14, and the process of storing the normal image in storage device 20 is repeated. Thereafter, when it is determined in step 106 that no normal image to be reclassified remains, the program ends.

In the stored image reclassification program of FIG. 5, the acquisition of the normal image and the acquisition of the inspection result are performed one by one in steps 101 to 102, but all the normal images and all the inspection results that can be acquired at that time may be acquired collectively.

In embodiment 1 described above, since the normal image classified by image recognition system 17 of component mounting machine 12 is automatically reclassified into images whose determination as a normal image is suspect or images whose determination as a normal image is not suspect, based on the inspection result of inspection device 14, and stored in storage device 20 by the stored image reclassification program of FIG. 5, it becomes unnecessary for an operator to visually check and reclassify a large number of normal images stored in storage device 20 one by one, and when investigating the cause of a mounting failure or the like, the investigation target can be narrowed down to the images whose determination as a normal image is suspect, thereby the investigation of the cause can be proceeded efficiently in a relatively short time.

As another method for using the normal image reclassified by the stored image reclassification program of FIG. 5, a classifier for recognizing a component may be created by learning a normal image reclassified by the reclassification section as a normal image whose determination as a normal image is not suspect. By doing so, it is possible to learn only the normal image for which the determination as being normal is not suspect as learning data for creating a high-precision classifier, and by mounting this classifier in image recognition system 17 of component mounting machine 12, it is possible to improve the component recognition accuracy of image recognition system 17 of component mounting machine 12.

In embodiment 1, inspection device 14 inspects whether the mounted state for each component mounted on circuit board 11 is acceptable, but when there is a mounting area on the mounting surface of circuit board 11 that cannot be inspected for each component or when inspecting each mounting area including multiple components, the normal images of all the components included in the mounting area in which the inspection result has failed may be reclassified as images for which the determination as normal is suspect.

Embodiment 2

Next, embodiment 2 will be described with reference to FIGS. 6 to 8. The same reference numerals are assigned to substantially the same parts as those in embodiment 1, and description thereof is omitted or simplified, and mainly different parts will be described.

In general, it is presumed that components which have been stably mounted on mounting positions of circuit boards 11 by the component mounting machine were picked up by the suction nozzle of component mounting machine 12 in a substantially similar orientation. In consideration of this characteristic, in embodiment 2, stored image reclassification computer 22 executes the stored image reclassification program of FIGS. 6 and 7, which will be described later, to measure component suction orientations (i.e., positions X, Y and angle θ) of multiple normal images stored in storage device 20 of component mounting machine 12, the measured values are then statistically processed for each component type to evaluate the distribution (see FIG. 8), and if it is determined that a normal image has any of the measured values X, Y, and θ falling outside the predetermined variation range, because there is a possibility of misrecognition, the image is reclassified as an image whose determination as a normal image is suspect, even if the image is determined to be a normal image by image recognition system 17 of component mounting machine 12.

In embodiment 2, the predetermined variation range is set by the following equation in accordance with the standard deviations (σX, σY, σθ) about the respective average values (Xav, Yav, θav) of the respective component positions X, Y and angles θ.

Predetermined variation range of X=average value Xav±standard deviation $$\sigma X \times aX \quad (1)$$

Predetermined variation range of Y=average value Yav±standard deviation $$\sigma Y \times aY \quad (2)$$

Predetermined variation range of θ=average value θav±standard deviation $$\sigma \theta \times a\theta \quad (3)$$

Here, aX, aY, aθ are coefficients for adjusting the size of the predetermined variation range. The coefficients aX, aY, aθ may be fixed values that are set in advance, or may be coefficients that can be adjusted by an input operation by an operator. In place of the average value, the median value, or the mode value, in other words, any value indicating the central position of the distribution of the measured values X, Y, and θ may be used.

Further, in embodiment 2, also for the abnormal image stored in storage device 20 of component mounting machine 12, the component suction orientation (X, Y, θ) of the abnormal image is measured, and the abnormal image is reclassified as an image whose determination as an abnormal image is suspect or as an image whose determination as an abnormal image is not suspect based on whether the measured values X, Y, θ are within a predetermined variation range of the component suction orientation of a normal image of the same component type as the component, and stored in the storage device 20. In short, the component suction orientation (X, Y, θ) of the abnormal image stored in storage device 20 is measured, and if the measured values X, Y, θ are within the predetermined variation range of the component suction orientation (X, Y, θ) of the normal image of the same component type as the component, the abnormal image falls within the predetermined variation range of the normal image and there is a possibility that the component suction orientation was misrecognized, and the determination of the abnormality by image recognition system 17 of component mounting machine 12 is reclassified as being suspect.

The reclassification of the normal image of embodiment 2 described above is executed by stored image reclassification computer 22 in accordance with the stored image reclassification program of FIGS. 6 and 7, as follows. The stored image reclassification program of FIGS. 6 and 7 may be executed by the control device of component mounting machine 12 or production management computer 21.

Figure 6:
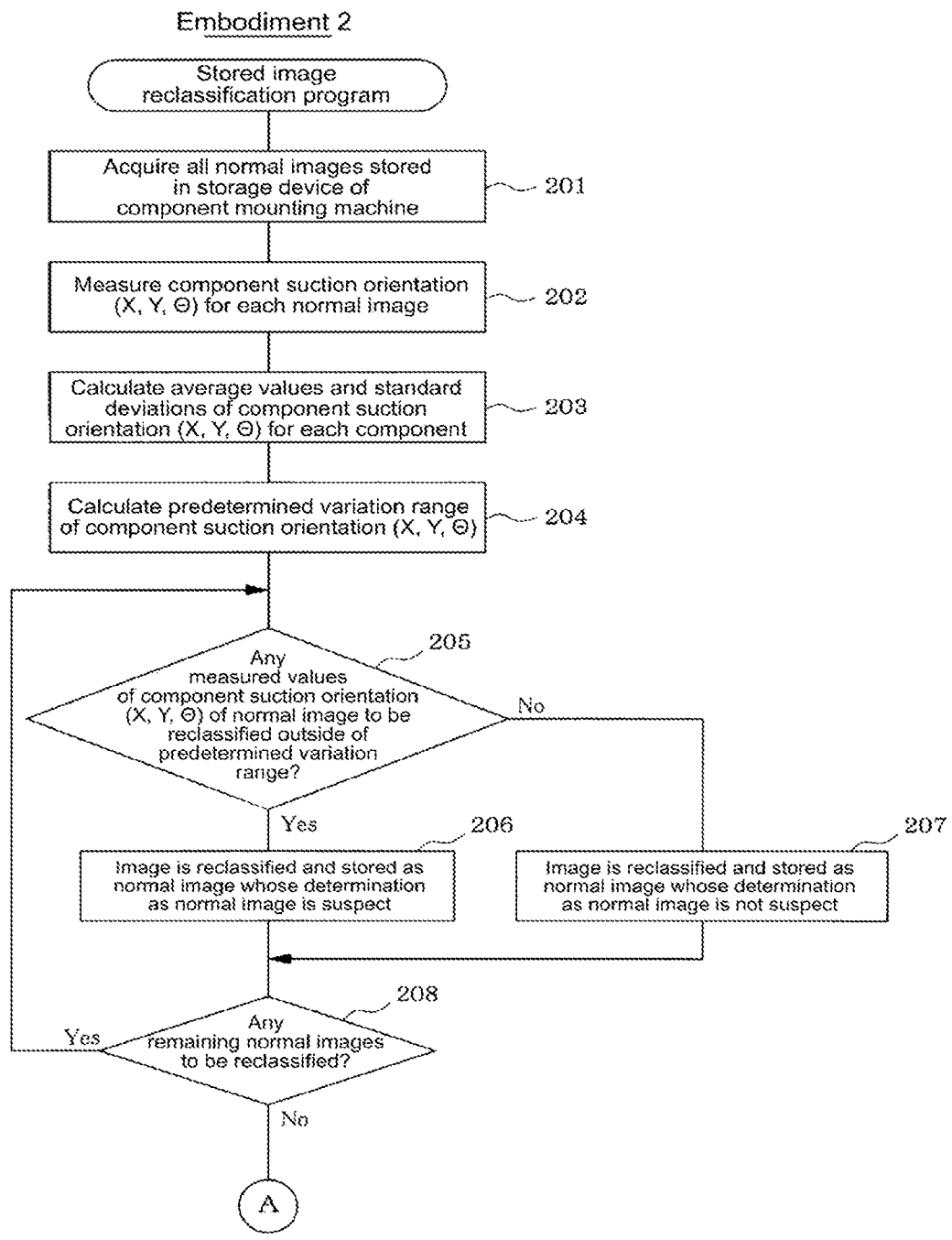
FIG. 6 is a flowchart showing the flow of processing in the first half of the stored image reclassification program of embodiment 2.
Figure 7:
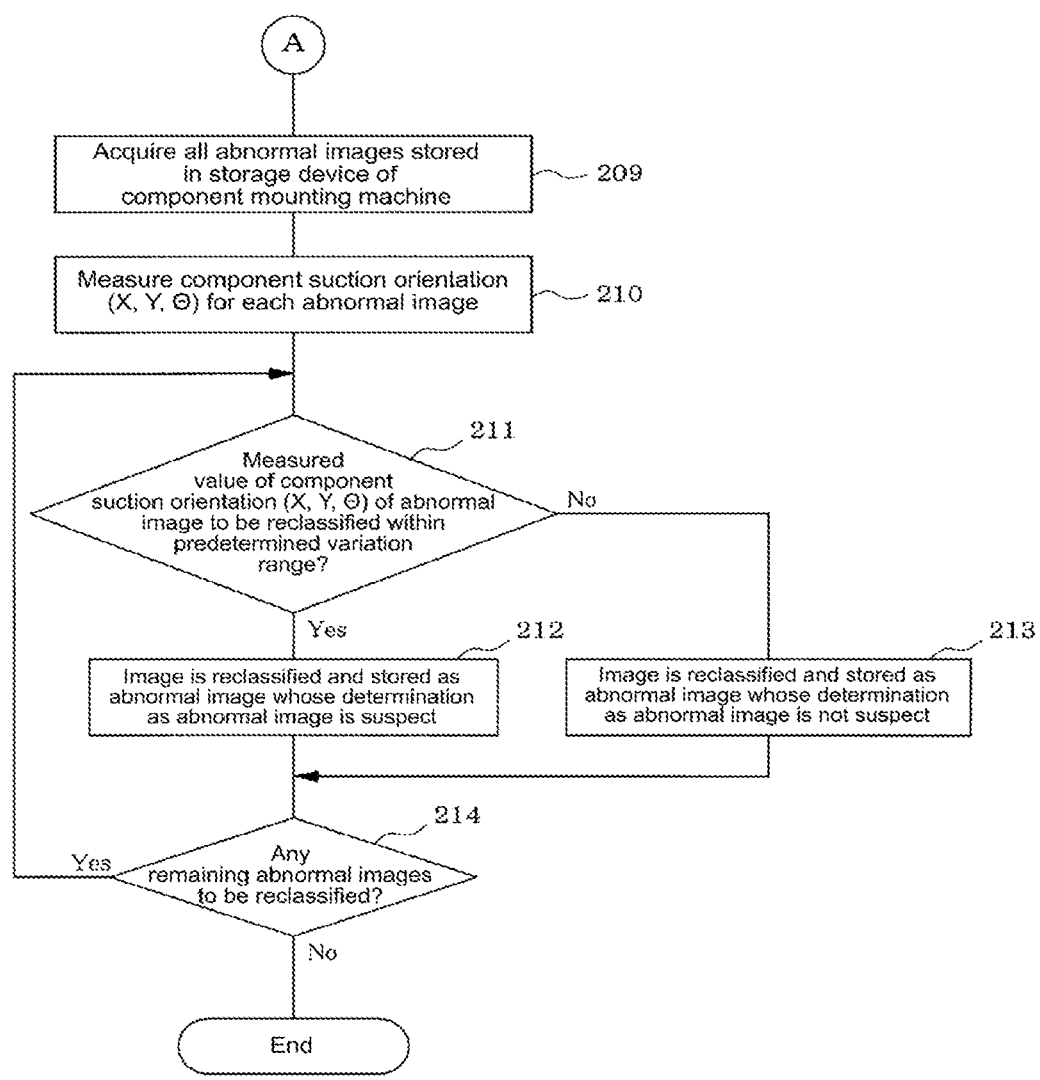
FIG. 7 is a flowchart showing the flow of processing in the second half of the stored image reclassification program of embodiment 2.
Figure 8:
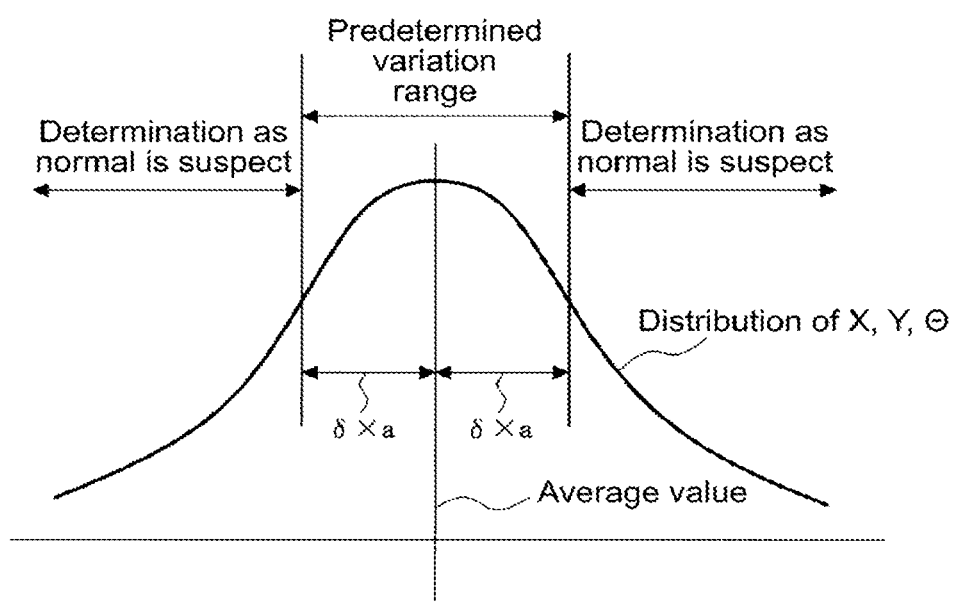
FIG. 8 is a diagram showing an example of a distribution of component suction orientations (X, Y, θ) of normal images.

The stored image reclassification program of FIGS. 6 and 7 is started after production is completed and functions as a "reclassification section". Even during production, the stored image reclassification program of FIGS. 6 and 7 may be executed after the number of images stored in storage device 20 of component mounting machine 12 reaches the number of images required to execute statistical processing (i.e., calculation of an average value and a standard deviation) with accuracy.

When the stored image reclassification program of FIGS. 6 and 7 is started, first, in step 201, all the normal images stored in storage device 20 of component mounting machine 12 are acquired, and then, in step 202, the component suction orientation (X, Y, θ) of each normal image is measured. The process of step 202 serves as a "component suction orientation measurement section".

Thereafter, the process proceeds to step 203, where the measured values of the component suction orientation (X, Y, θ) are statistically processed for each component type, and the average values (Xav, Yav, θav) and the standard deviations (σX, σY, σθ) are calculated. Thereafter, the process proceeds to step 204, and a predetermined variation range of the component suction orientation (X, Y, θ) is calculated using the above-described equations (1) to (3).

Thereafter, the process proceeds to step 205, where it is determined whether the measured values of the component suction orientation (X, Y, θ) of the normal image to be reclassified fall outside the predetermined variation range, and as a result, if it is determined that a measured value of the component suction orientation (X, Y, θ) of the normal image falls outside the predetermined variation range, the process proceeds to step 206, where the normal image is reclassified as an image whose determination as a normal image is suspect, after which the image is stored in storage device 20 and the process proceeds to step 208. On the other hand, if it is determined in step 205 that the measured values of the component suction orientation (X, Y, θ) of the normal image is within the predetermined variation range, the process proceeds to step 207, where the normal image is reclassified as a normal image and stored in storage device 20, and the process proceeds to step 208.

In step 208, it is determined whether a normal image to be reclassified remains, and if it is determined that a normal image remains, the above-described process of step 205 and subsequent steps is repeated, the normal image is reclassified as an image whose determination as a normal image is suspect or as an image whose determination as a normal image is not suspect based on whether the measured values of the component suction orientation (X, Y, θ) of the normal image falls outside the predetermined variation range, and the process of storing the normal image in storage device 20 is repeated.

Thereafter, when it is determined in step 208 that no normal image to be reclassified remains, the process in step 209 and subsequent steps of FIG. 7 is executed, the abnormal image stored in storage device 20 of component mounting machine 12 is also reclassified as an image whose determination as an abnormal image is suspect or as an image whose determination as an abnormal image is not suspect, and the image is stored in storage device 20 as follows.

First, in step 209, all the abnormal images stored in storage device 20 of component mounting machine 12 are acquired, and then the process proceeds to step 210, where the component suction orientations (X, Y, θ) of the abnormal images are measured. The process of step 210 serves as a "component suction orientation measurement section". Thereafter, the process proceeds to step 211, where it is determined whether the measured values of the component suction orientation (X, Y, θ) of the abnormal images to be reclassified are within a predetermined variation range of the component suction orientation of a normal image of the same component type. In this case, as the predetermined variation range, the values calculated in step 204 may be used as is, or the size of the predetermined variation range may be changed by changing the coefficients aX, aY, aθ for adjusting the size of the predetermined variation range.

If it is determined in step 211 that the measured values of the component suction orientation (X, Y, θ) of the abnormal image are within the predetermined variation range of the normal image, the process proceeds to step 212, where the abnormal image is reclassified as an image whose determination as an abnormal image is suspect and the image is stored in storage device 20, and the process proceeds to step 214. On the other hand, if it is determined in step 211 that the measured values of the component suction orientation (X, Y, θ) of the abnormal image falls outside the predetermined variation range of the normal image, the process proceeds to step 213, where the abnormal image is reclassified as an image whose determination as an abnormal image is not suspect and the image is stored in storage device 20, and the process proceeds to step 214.

In step 214, it is determined whether an abnormal image to be reclassified remains, and if it is determined that an abnormal image remains, the above-described process from step 211 and subsequent steps are repeated, the abnormal image is reclassified as an image whose determination as an abnormal image is suspect or as an image whose determination as an abnormal image is not suspect based on whether the measured values for the component suction orientation (X, Y, θ) of the abnormal image fall within the predetermined variation range of the normal image, and the process of storing the abnormal image in storage device 20 is repeated. Thereafter, when it is determined in step 214 that no abnormal image to be reclassified remains, the program ends.

Also in embodiment 2 described above, the same effects as in embodiment 1 can be obtained. Further, in embodiment 2, since the abnormal images stored in storage device 20 of component mounting machine 12, based on whether the measured values of the component suction orientation (X, Y, θ) are within a predetermined variation range of the component suction orientation of a normal image of the same component type, are also reclassified into images whose determinations as the abnormal image are suspect or images whose determinations as the abnormal image are not suspect, it becomes unnecessary for an operator to visually check and reclassify the abnormal images stored in the storage device 20 one by one, and when investigating the cause of a mounting failure or the like, the investigation target can be narrowed down to images whose determination as an abnormal image is suspect, thereby the investigation of the cause can be proceeded efficiently in a relatively short time.

Note that, when image recognition system 17 of component mounting machine 12 determines that the image is an abnormal image, since the component picked up by the suction nozzle is discarded without being mounted on circuit board 11, if the number of erroneous determinations of abnormal images increases, wasteful discarding of components increases, production time becomes longer, and production does not end as scheduled. Therefore, when production delays become remarkable, the operator needs to investigate the cause. In this case, the operator may visually check the abnormal images stored in storage device 20 of component mounting machine 12 to examine whether there is a large amount of wasteful component discards, but visually checking the many abnormal images stored in storage device 20 one by one is very laborious.

In this regard, in embodiment 2, since the abnormal images stored in storage device 20 of component mounting machine 12 are reclassified into images whose determination as abnormal images are suspect or images whose determination as abnormal images are not suspect, when there are many wasteful component discards (i.e., when the production is not completed as scheduled), the operator can narrow down the target images to examine to abnormal images whose determination as abnormal images is suspect, and quickly becomes aware of the cause of the large amount of wasteful component discards.

As another method for using the normal image reclassified by the stored image reclassification program of FIGS. 6 and 7, a classifier for recognizing a component may be created by learning a normal image reclassified by the reclassification section as a normal image whose determination as a normal image is not suspect and this classifier may be mounted in image recognition system 17 of component mounting machine 12.

Embodiment 3

Next, embodiment 3 will be described with reference to FIGS. 9 and 10. However, the same reference numerals are assigned to substantially the same parts as in embodiment 1, and description thereof is omitted or simplified, and mainly the parts which differ will be described.

Figure 9:
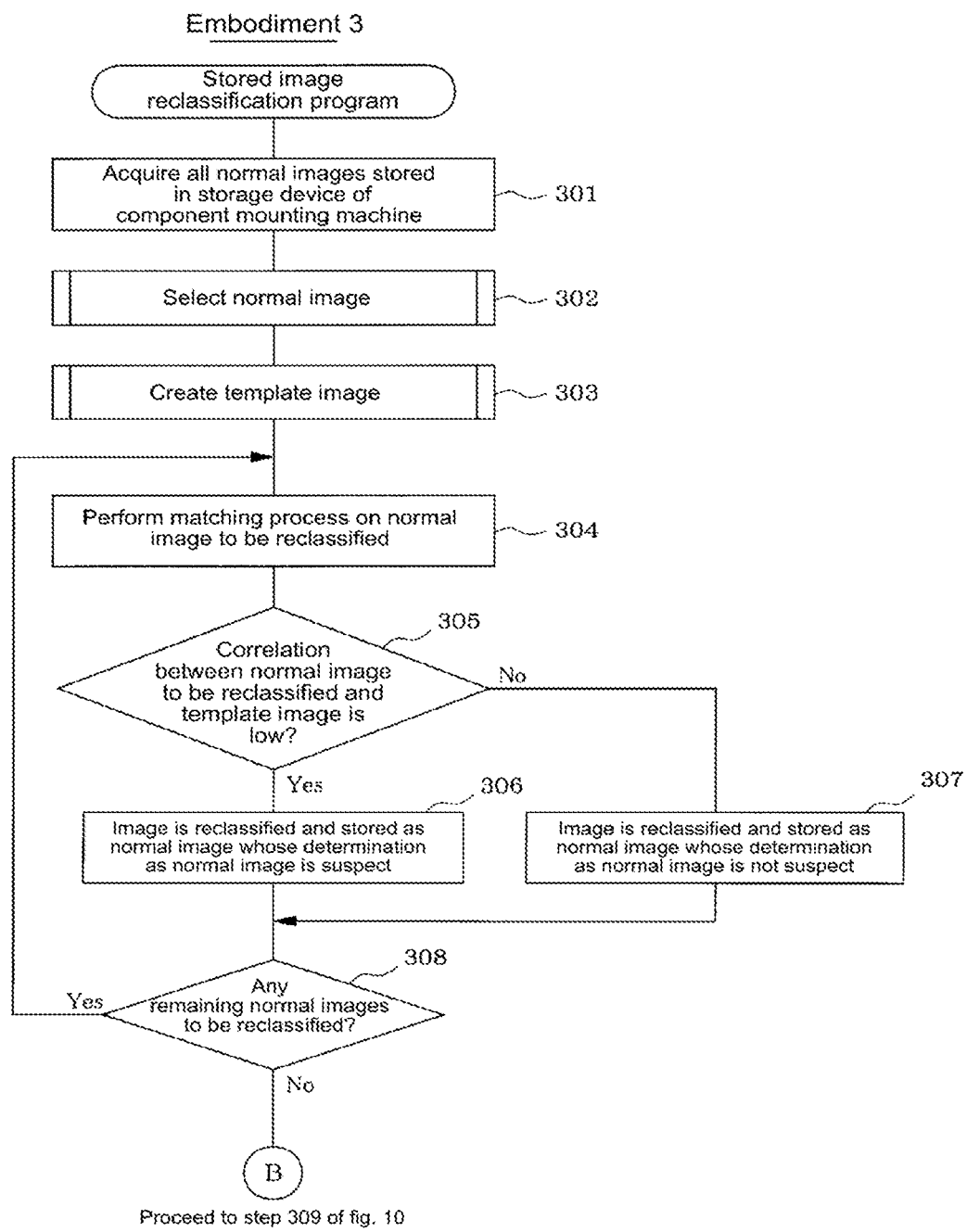
FIG. 9 is a flowchart showing the flow of processing in the first half of the stored image reclassification program according to embodiment 3.
Figure 10:
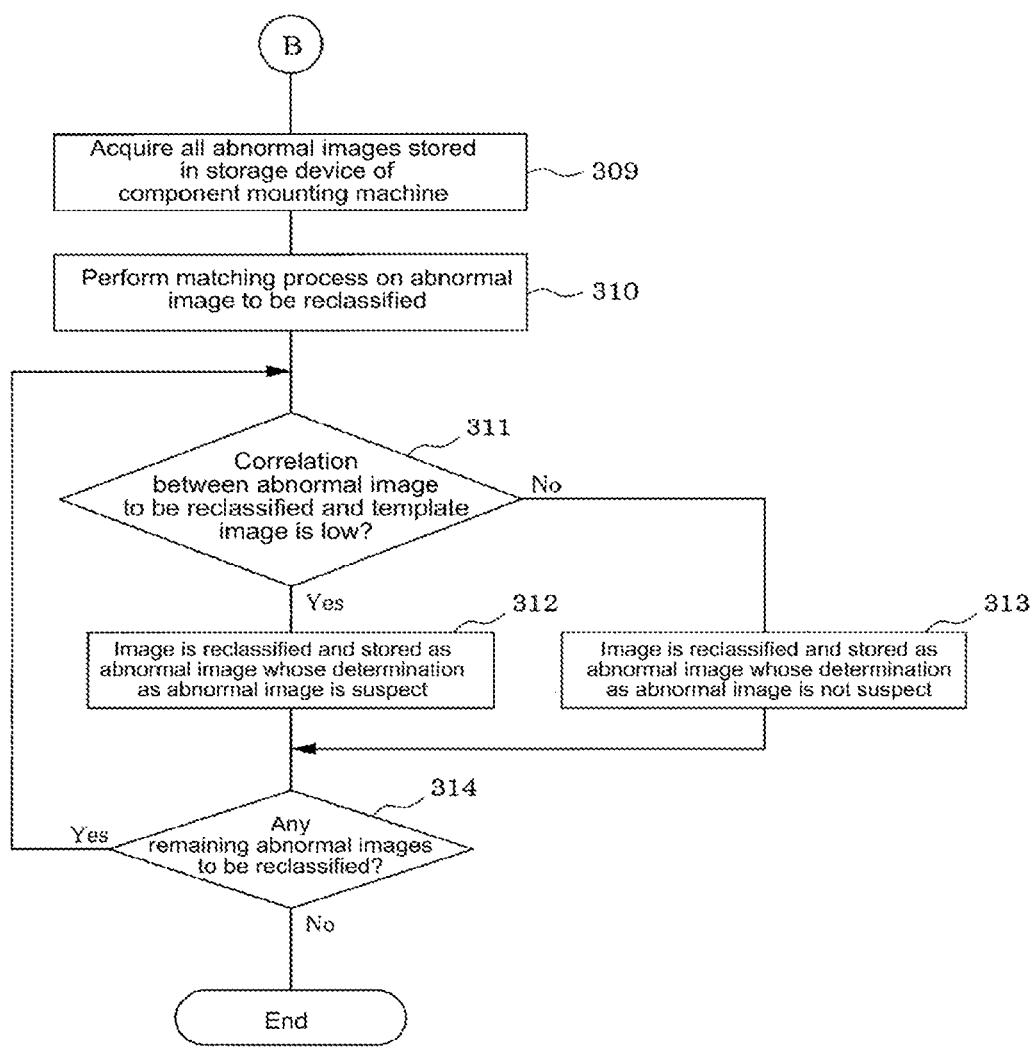
FIG. 10 is a flowchart showing the flow of processing of the latter half of the stored image reclassification program of embodiment 3.

In embodiment 3, by executing the stored image reclassification program of FIGS. 9 and 10 with stored image reclassification computer 22, a template image is created by selecting one of multiple normal images stored in storage device 20 of component mounting machine 12 whose determination as a normal image is not suspect, and by performing a matching process of matching the remaining normal images with the template image, the normal image is reclassified and stored in storage device 20 as a normal image whose determination as a normal image is not suspect, and also by performing a matching process of the abnormal image stored in storage device 20 with the template image, the abnormal image is reclassified and stored in storage device 20 as an abnormal image whose determination as an abnormal image is suspect or not suspect.

As described above, if the matching process is performed on the remaining normal images using the template image created using a normal image whose determination as a normal image is not suspect, the correlation value and the deviation amount, both of which serve as indices indicating the correlation (i.e., the similarity) between the two images, can be obtained. When the correlation between the two images is low (i.e., when the correlation value is low or when the deviation amount is very different from the recognition result of image recognition system 17 of component mounting machine 12), even if image recognition system 17 of component mounting machine 12 determines that the image is a normal image, there is a possibility that the image was misrecognized and therefore the image can be reclassified as an image whose determination as a normal image is suspect.

Further, a matching process is performed on the abnormal image with a template image created using a normal image whose determination as a normal image is not suspect, and in the case where the correlation between the two images is high, even if image recognition system 17 of component mounting machine 12 determines that the image is an abnormal image, the image may be reclassified as an image whose determination as an abnormal image is suspect since there is a possibility that the image was misrecognized. Here, "determination as an abnormal image is suspect" means "there is a possibility that the image is not an abnormal image".

The reclassification of the stored image of embodiment 3 described above is executed by stored image reclassification computer 22 in accordance with the stored image reclassification program of FIGS. 9 and 10. The stored image reclassification program of FIGS. 9 and 10 is started during production (i.e., during operation of component mounting machine 12) or after production is completed, and functions as a "reclassification section". The stored image reclassification program of FIGS. 9 and 10 may be executed by the control device of component mounting machine 12 or production management computer 21.

When the stored image reclassification program of FIGS. 9 and 10 is started, first, in step 301, all the normal images stored in the storage device 20 of the component mounting machine 12 are acquired, then the process proceeds to step 302, in which one of the acquired normal images whose determination as a normal image is not suspect is selected by any one of the following methods (1) to (3). The process of step 302 serves as a "normal image selection section".

(1) Similarly to embodiment 1, one of the multiple normal images acquired in step 301 whose determination as a normal image is not suspect is selected based on the inspection result of inspection device 14, which inspects component mounting boards carried out from component mounting device 12. That is, the normal image of the component for which the inspection result of the inspection device 14 has passed is selected as a normal image whose determination as a normal image is not suspect.

(2) Similarly to embodiment 2, the component suction orientations (X, Y, θ) of the multiple normal images acquired in step 301 are measured, the measured values are statistically processed for each component type, and one of the multiple normal images (for example, a normal image located at the center of the distribution) whose determination as a normal image is not suspect is selected from the multiple normal images based on the processing result.

(3) An average normal image is created from the multiple normal images acquired in step 301, and the average normal image is selected as a normal image whose determination as a normal image is not suspect. In this case, an average image created by simply averaging the multiple normal images may be used, or an average normal image may be created by using another method (for example, KL expansion).

Thereafter, the process proceeds to step 303, where the normal image is moved and rotated so that the position (X, Y) and the angle θ of the component of the normal image selected in step 301, whose determination as a normal image is not suspect, respectively coincide with the position and angle of a reference position, thereby creating a template image. The process of step 302 serves as a "template image creation section".

Thereafter, the process proceeds to step 304, in which a matching process (e.g., normalized correlation, phase-limited correlation, etc.) is performed on the normal image to be reclassified using the template image, and a correlation value and a deviation amount, both of which are indices indicating the correlation between the two images, are obtained.

Then, in the next step, step 305, it is determined whether the correlation between the normal image to be reclassified and the template image is low based on the correlation value and the deviation amount. In this case, when the correlation value is smaller than a predetermined value or when the deviation amount is significantly different from the recognition result of image recognition system 17 of component mounting machine 12 by a predetermined value or more, it is determined that the correlation between the two images is low, and the process proceeds to step 306, where the normal image is reclassified as an image whose determination as a normal image is suspect and is stored in storage device 20, and the process proceeds to step 308. On the other hand, if it is determined in step 305 that the correlation between the two images is high, the process proceeds to step 307, where the normal image is reclassified as a normal image and stored in storage device 20, and the process proceeds to step 308.

In step 308, it is determined whether a normal image to be reclassified remains, and if it is determined that a normal image remains, the above-described process from step 304 and subsequent steps is repeated, the normal image is reclassified as an image whose determination as a normal image is suspect or as an image whose determination as a normal image is not suspect based on whether the correlation between the normal image to be reclassified and the template image is low, and the process of storing the abnormal image in storage device 20 is repeated. Thereafter, when it is determined in step 308 that no normal image to be reclassified remains, the process in step 309 and subsequent steps in FIG. 10 is executed, and the abnormal image stored in storage device 20 of component mounting machine 12 is also reclassified, as will be described next, as an image whose determination as an abnormal image is suspect or not suspect, and stored in the storage device 20.

First, in step 309, after all the abnormal images stored in storage device 20 of component mounting machine 12 are acquired, the process proceeds to step 310, in which a matching process (e.g., normalized correlation, phase limited correlation, etc.) is performed on the abnormal images to be reclassified using the template image created in step 303, and a correlation value and a deviation amount, both of which serve as indices indicating the correlation between the two images, are obtained.

Then, in the next step, step 311, it is determined whether the correlation between the abnormal image to be reclassified and the template image is high based on the correlation value and the deviation amount. In this case, when the correlation value is larger than the predetermined value or when the deviation amount is not very different from the recognition result of image recognition system 17 of component mounting machine 12, it is determined that the correlation between the two images is high, and the process proceeds to step 312, where the abnormal image is reclassified as an image whose determination as an abnormal image is suspect and is stored in storage device 20, after which the process proceeds to step 314. On the other hand, if it is determined in step 311 that the correlation between the two images is low, the process proceeds to step 312, where the abnormal image is reclassified as an image whose determination as an abnormal image is not suspect and then stored in the storage device 20, and the process proceeds to step 314.

In step 314, it is determined whether an abnormal image to be reclassified remains, and if it is determined that an abnormal image remains, the above-described process from step 310 and subsequent steps is repeated, the abnormal image is reclassified as an image whose determination as an abnormal image is suspect or as an image whose determination as an abnormal image is not suspect based on whether the correlation between the abnormal image to be reclassified and the template image is high, and the process of storing the abnormal image in storage device 20 is repeated. Thereafter, when it is determined in step 314 that no abnormal image to be reclassified remains, the program ends. The same effects as those of embodiments 1 and 2 can be obtained also in embodiment 3 described above.

As another method for using the normal image reclassified by the stored image reclassification program of FIGS. 9 and 10, a classifier for recognizing a component may be created by learning a normal image reclassified by the reclassification section as a normal image whose determination as a normal image is not suspect and this classifier may be mounted in image recognition system 17 of component mounting machine 12.

In above-described embodiments 1 to 3, the normal image and the abnormal image are stored in storage device 20 of component mounting machine 12, but may be stored in the storage device of stored image reclassification computer 22, the storage device of production management computer 21, or another server.

Further, the present invention is not limited to above-mentioned embodiments 1 to 3, and it is needless to state that the present invention can be implemented by various modifications within a range that does not deviate from the gist, for example, the configuration of component mounting line 10 may be changed.

DESCRIPTION OF REFERENCE NUMERALS

10 . . . Component mounting line, 11 . . . Circuit board, 12 . . . Component mounting machine, 14 . . . Inspection device, 17 . . . Image recognition system, 19 . . . Feeder, 20 . . . Storage device, 22 . . . Stored image reclassification computer (reclassification section, component suction orientation measurement section, normal image selection section, template image creation section, matching processing section)

The invention claimed is:

1. A stored image reclassification system used for a system configured to
    image a component by a camera, the component being picked up by a suction nozzle of a component mounting machine,
    recognize the component by processing the captured image using an image recognition system,
    determine the image to be normal or abnormal based on the recognition result;
    classify the image as a normal image or an abnormal image and store the image in a storage device, and
    inspect a component mounting board unloaded from the component mounting machine with an inspection device,
    the stored image reclassification system comprising:
    a reclassification section configured to reclassify the normal image, based on the inspection result of the inspection device, as an image whose determination as a normal image is suspect or as an image whose determination as a normal image is not suspect, and store the normal image in the storage device.

2. The stored image reclassification system according to claim 1, wherein
    the inspection device is configured to inspect whether a mounting state for each component mounted on the circuit board is acceptable, and
    the reclassification section is configured to, from among the normal images, reclassify the normal image of the component whose inspection result of the inspection device is unacceptable as the normal image for which the determination is suspect.

3. A stored image reclassification system used for a system configured to
    image a component by a camera, the component being picked up by a suction nozzle of a component mounting machine,
    recognize the component by processing the captured image by an image recognition system,
    determine the image to be normal or abnormal based on the recognition result, and
    classify the image as a normal image or an abnormal image and store the image in a storage device,
    the stored image reclassification system comprising:
    a component suction orientation measurement section configured to measure positions and angles of components of multiple normal images stored in the storage device, and
    a reclassification section configured to statistically process the positions and the angles of the components of the normal images measured by the component suction orientation measurement section for each component type, and reclassify the normal image as an image for which the determination as a normal image is suspect or as an image for which the determination as a normal image is not suspect, based on whether the position or the angle of the component falls outside a predetermined variation range, and store the normal image in the storage device.

4. The stored image reclassification system according to claim 3, wherein
    the reclassification section is configured to set the predetermined variation range based on a standard deviation from an average value for each position and angle of the component.

5. The stored image reclassification system according to claim 3, wherein
    the component suction orientation measurement section is also configured to measure the position and angle of the component of the abnormal image stored in the storage device, and the reclassification section is configured to reclassify the abnormal image as an image whose determination as an abnormal image is suspect or as an image whose determination as an abnormal image is not suspect, based on whether both the position and the angle of the component of the abnormal image measured with the component suction orientation measurement section are within a predetermined variation range of the normal image of the same component type as the component, and store the abnormal image in the storage device.

6. A stored image reclassification system used for a system configured to
    image a component by a camera, the component being picked up by a suction nozzle of a component mounting machine,
    recognize the component by processing the captured image by an image recognition system,
    determine the image to be normal or abnormal based on the recognition result, and
    classify the image as a normal image or an abnormal image and store the image in a storage device,
    the stored image reclassification system comprising:
    a normal image selection section configured to select a normal image whose determination as a normal image is not suspect from among multiple normal images stored in a storage device, and
    a template image creation section configured to create a template image by moving and rotating the normal image so that the position and the angle of the component of the normal image selected by the normal image selection section coincide with the position and angle of a reference position;
    a matching processing section configured to match remaining normal images using the template image created by the template image creation section; and
    a reclassification section configured to reclassify the normal image as an image whose determination as a normal image is suspect or as an image whose determination as a normal image is not suspect based on the processing result of the matching processing section, and store the image in the storage device.

7. The stored image reclassification system according to claim 6, wherein
    the normal image selection section is configured to select a normal image for which the determination as being normal is not suspect from among multiple normal images stored in the storage device based on the inspection result of the inspection device, which inspects component mounting boards unloaded from the component mounting machine.

8. The stored image reclassification system according to claim 6, wherein
    the normal image selection section is configured to measure the positions and angles of the components of multiple normal images stored in the storage device, perform statistical processing on the measured values for each component type, and select a normal image, from among the multiple normal images based on the processing result, whose determination as a normal image is not suspect.

9. The stored image reclassification system according to claim 6, wherein
    the normal image selection section is configured to create an average normal image from multiple normal images stored in the storage device and select the average normal image as a normal image whose determination as a normal image is not suspect.

10. The stored image reclassification system according to claim 6, wherein
    the matching processing section is also configured to match the abnormal image using the template image, and
    the reclassification section is configured to reclassify the abnormal image based on the processing result of the matching processing section as an abnormal image whose determination as an abnormal image is suspect or as an abnormal image whose determination as an abnormal image is not suspect, and store the image in the storage device.

11. The stored image reclassification system according to claim 1, further comprising
    a classifier creation section configured to learn a normal image reclassified by the reclassification section as a normal image whose determination as a normal image is not suspect and create a classifier for classifying the normal image.

12. A method for reclassifying stored images comprising:
    imaging a component by a camera, the component being picked up by a suction nozzle of a component mounting machine;
    recognizing the component by processing the captured image by an image recognition system;
    determining the image to be normal or abnormal based on the recognition result;
    classifying the image as a normal image or an abnormal image and store the image in a storage device;
    inspecting a component mounting board unloaded from the component mounting machine with an inspection device of an inspection system;
    reclassifying the normal image based on the inspection result of the inspection device as an image whose determination as a normal image is suspect or as an image whose determination as a normal image is not suspect, and thereafter
    storing the reclassified image in the storage device.

13. A method for reclassifying stored images comprising to:
    imaging a component by a camera, the component being picked up by a suction nozzle of a component mounting machine;
    recognizing the component by processing the captured image by an image recognition system;
    determining the image to be normal or abnormal based on the recognition result,
    classifying the image as a normal image or an abnormal image, and
    storing the image in a storage device,
    wherein the positions and angles of components of multiple normal images stored in the storage device are measured, and the measured positions and angles of the components are statistically processed for each component type to reclassify the normal image, whose determination as a normal image is suspect or not suspect, based on whether any of the positions and angles of the components falls outside a predetermined variation range, and the normal image is stored in the storage device.

14. A method for reclassifying stored images comprising:
    imaging a component by a camera, the component being picked up by a suction nozzle of a component mounting machine;
    recognizing the component by processing the captured image by an image recognition system;
    determining the image to be normal or abnormal based on the recognition result, classifying the image as a normal image or an abnormal image, and storing the image in a storage device, wherein a normal image, whose determination as a normal image is not suspect, is selected from among multiple normal images stored in a storage device;

a template image is created by moving and rotating the selected normal image so that the position and angle of the component of the normal image coincide with the position and angle of a reference position; and a matching process is performed on the remaining normal images by using the created template image, and the normal image is reclassified as an image whose determination as a normal image is suspect or as an image whose determination as a normal image is not suspect based on the processing result of the matching processing section, thereafter the reclassified image is stored in the storage device.

\* \* \* \* \*